US008126151B2

(12) United States Patent
Obuchi et al.

(10) Patent No.: US 8,126,151 B2
(45) Date of Patent: Feb. 28, 2012

(54) AUDIO SIGNAL PROCESSING CIRCUIT

(75) Inventors: Masahiro Obuchi, Gunma-ken (JP); Masashi Aramomi, Gunma-ken (JP); Toru Odajima, Ota (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 712 days.

(21) Appl. No.: 12/265,378

(22) Filed: Nov. 5, 2008

(65) Prior Publication Data

US 2009/0136046 A1 May 28, 2009

(30) Foreign Application Priority Data

Nov. 7, 2007 (JP) ................................ 2007-290051
Oct. 7, 2008 (JP) ................................ 2008-260396

(51) Int. Cl.
*H01L 5/02* (2006.01)

(52) U.S. Cl. .............................. 381/17; 381/18; 381/19

(58) Field of Classification Search ................ 381/1, 17, 381/18, 19
See application file for complete search history.

(56) References Cited

U.S. PATENT DOCUMENTS

2007/0211904 A1* 9/2007 Sakagami ...................... 381/17

FOREIGN PATENT DOCUMENTS

JP 2006-262521 9/2006
JP 2007-088657 4/2007

* cited by examiner

*Primary Examiner* — Hung Vu
(74) *Attorney, Agent, or Firm* — SoCal IP Law Group LLP; Steven C. Sereboff; John E. Gunther

(57) ABSTRACT

An audio signal processing circuit comprising: a holding circuit configured to receive a clock signal and set data corresponding to the clock signal, and to hold the set data; a processing circuit configured to process at least one of a first audio signal and a second audio signal input in parallel, based on the set data of the holding circuit; and a set data output circuit configured to output the clock signal to the holding circuit based on the first audio signal corresponding to the clock signal, and output the set data to the holding circuit based on the second audio signal corresponding to the set data.

11 Claims, 5 Drawing Sheets

AUDIO SIGNAL PROCESSING CIRCUIT

CROSS-REFERENCE TO RELATED APPLICATIONS

This application claims the benefit of priority to Japanese Patent Application Nos. 2007-290051 and 2008-260396, filed Nov. 7, 2007 and Oct. 7, 2008, respectively, of which full contents are incorporated herein by reference.

BACKGROUND OF THE INVENTION

1. Field of the Invention

The present invention relates to an audio signal processing circuit.

2. Description of the Related Art

Recently, an FM (frequency modulation) transmission circuit is used to reproduce music data recorded in a portable music reproduction device, etc., for example, by a car stereo (Japanese Patent Laid-Open Publications No. 2006-262521 and No. 2007-88657, for example.)

FIG. 5 shows an example of a commonly-used configuration of a transmission device 200 including an FM transmission circuit 300 for transmitting an audio signal. A frequency of a carrier wave in the FM transmission circuit 300 is required to be determined in consideration with a frequency of an FM radio, etc., being used in a surrounding area. Thus, firstly a user is required to set the frequency of the carrier wave in the FM transmission circuit 300. Specifically, the user operates a key (not shown) of a setting device 310 so that the frequency of the carrier wave displayed on a display screen (not shown) of the setting device 310 becomes a desirable frequency. Furthermore, after the frequency of the carrier wave is determined, the user operates the key (not shown) of the setting device 310 so that frequency data of the carrier wave is output to a microcomputer 320. The microcomputer 320 outputs the frequency data from the setting device 310, as serial data SDA synchronized with a clock signal SCL, to the FM transmission circuit 300. The FM transmission circuit 300 generates a stereo composite signal based on audio signals RIN and LIN input from a music reproduction device 330 and a carrier wave of a frequency based on the serial data SDA input from the microcomputer 320, and modulates the carrier wave by the stereo composite signal, to be output as an output signal OUT to an antenna (not shown). The resistors 400 and 410 are pull-up resistors respectively for the clock signal SCL and the serial data SDA.

In the above transmission device 200, other than the FM transmission circuit 300, the setting device 310 and the microcomputer 320 are required for setting the frequency of the carrier wave in the FM transmission circuit 300. In general, the setting device 310 includes a display screen (not shown) for displaying the frequency of the carrier wave, a driving circuit for driving the display screen, etc. The microcomputer 320 is configured on a separate chip from that on which the FM transmission circuit 300 is. Furthermore, in a common transmission device 200, for example, in a case where the user sets transmission power for the FM transmission circuit 300, there are also required the microcomputer 320, etc., as in a case of setting the frequency of the carrier wave as described above. Thus, there has been a problem that a mounting area of the transmission device 200 becomes large.

SUMMARY OF THE INVENTION

An audio signal processing circuit according to an aspect of the present invention, comprises: a holding circuit configured to receive a clock signal and set data corresponding to the clock signal, and to hold the set data; a processing circuit configured to process at least one of a first audio signal and a second audio signal input in parallel, based on the set data of the holding circuit; and a set data output circuit configured to output the clock signal to the holding circuit based on the first audio signal corresponding to the clock signal, and output the set data to the holding circuit based on the second audio signal corresponding to the set data.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
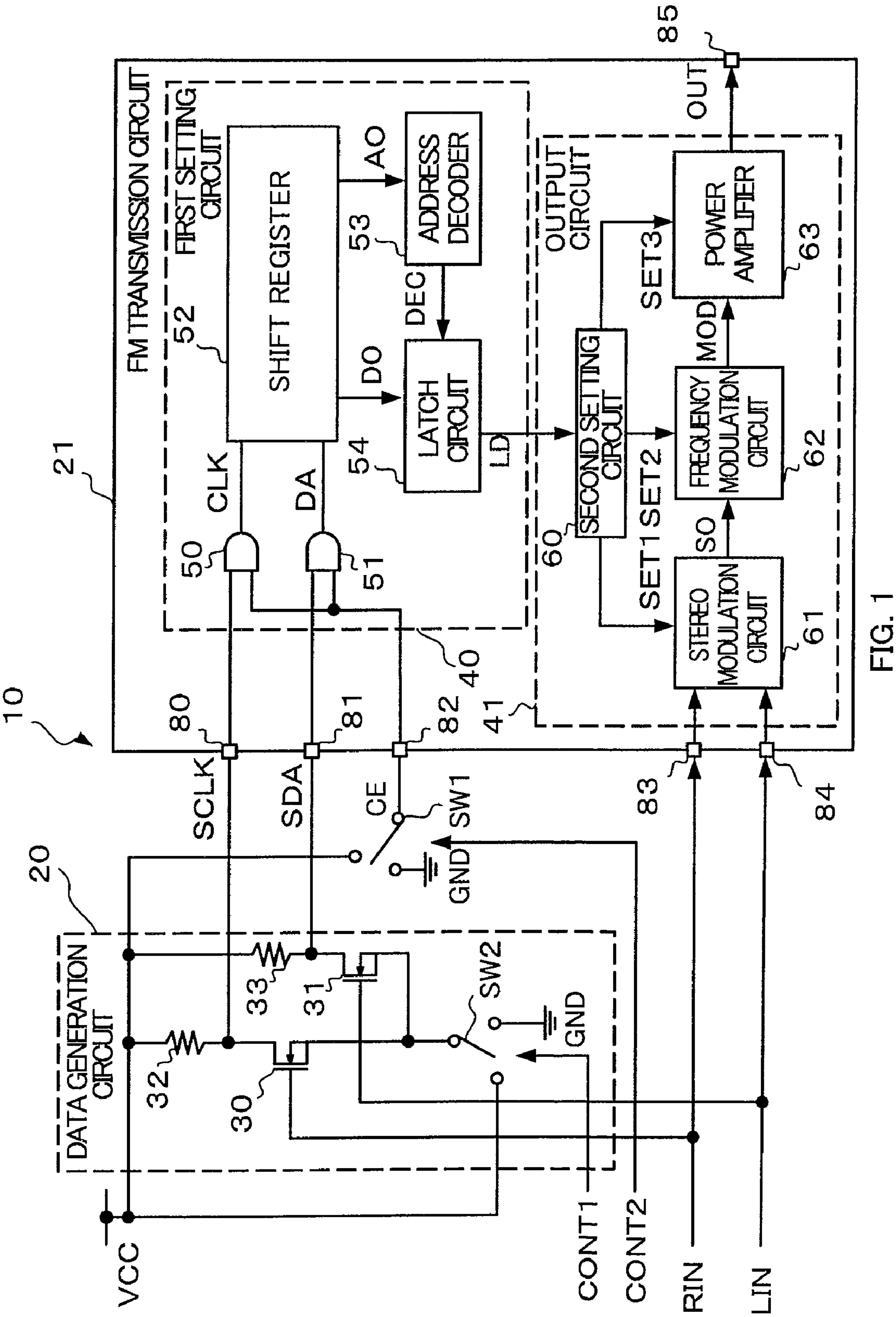
FIG. 1 is a diagram showing a configuration of a transmission device 10, which is an embodiment of the present invention.

FIG. 1 is a diagram showing a configuration of a transmission device 10, which is an embodiment of the present invention. The transmission device 10 is a device for outputting an output signal OUT (output signal) to an antenna (not shown) so as to transmit audio signals RIN (first audio signal) and LIN (second audio signal) input from, for example, a music reproduction device (not shown), based on levels of a first control signal CONT1 (selection signal) and a second control signal CONT2 (update control signal) each of which is input from an external switch (not shown) such as a toggle switch. The transmission device 10 includes a data generation circuit 20, an FM transmission circuit 21, and a switch SW1. In an embodiment of the present invention, the audio signals RIN and LIN respectively correspond to a right-side audio signal and a left-side audio signal of stereo audio signals.

First, outlines of circuits included in the transmission device 10 are described.

The data generation circuit 20 is a circuit for generating a clock signal SCLK (first output signal) and data SDA (second output signal) that are digital signals respectively according to levels of audio signals RIN and LIN input from a music reproduction device (not shown), based on the first control signal CONT1. The data generation circuit 20 includes NMOS transistors 30, 31, resistors 32, 33, and a switch SW2. It is assumed that the first control signal CONT1 is set either to a high level (hereinafter, H-level) or a low level (hereinafter, L-level) by an external switch (not shown) being operated by a user. The data generation circuit 20 corresponds to a set-data output circuit of the present invention.

The FM transmission circuit 21 is a circuit for outputting the audio signals RIN and LIN, as the output signal OUT that can be received by an FM radio (not shown,) based on the clock signal SCLK and data SDA output from the data generation circuit 20, and an enable signal CE (instruction signal) output from the switch SW1. The FM transmission circuit 21 includes a first setting circuit 40, an output circuit 41, and terminals 80-85. It is assumed that the FM transmission circuit 21 is an integrated circuit.

The first setting circuit 40 is a circuit for outputting to the output circuit 41 latch data LD for setting a frequency, a level, etc., of the output signal OUT output from the FM transmission circuit 21, based on the clock signal SCLK, data SDA, and enable signal CE. The first setting circuit 40 includes AND circuits 50 and 51, a shift register 52, an address decoder 53, and a latch circuit 54. The clock signal SCLK, data SDA, and enable signal CE are input respectively via the terminals 80-82.

The output circuit 41 is a circuit for performing processing such as modulation and amplification for the audio signals RIN and LIN input via the terminals 83, 84 from the music reproduction device (not shown,) based on the latch data LD input from the first setting circuit 40, to be output as the output signal OUT which can drive the antenna (not shown) connected to the terminal 85. The output circuit 41 includes a second setting circuit 60, a stereo modulation circuit 61, a frequency modulation circuit 62, and a power amplifier 63.

The switch SW1 outputs the enable signal CE to the terminal 82 based on the second control signal CONT2 which is set either to a high level (hereinafter, H-level) or a low level (hereinafter, L-level) by operating the external switch (not shown.) In an embodiment of the present invention, it is assumed that the enable signal CE is H-level when the second control signal CONT2 is H-level, and the enable signal CE is L-level when the second control signal CONT2 is L-level. In other words, when the second control signal CONT2 is H-level, the switch SW1 is so operated that a power supply VCC is connected with the terminal 82, and when the second control signal CONT2 is L-level, the switch SW1 so operated that a ground GND is connected with the terminal 82.

Next, the circuits included in the transmission device 10 are described in detail.

The switch SW2 of the data generation circuit 20 is connected to each of source electrodes of the NMOS transistors 30 and 31 at one end thereof. The switch SW2 is connected, at the other end thereof, to the ground GND when the first control signal CONT1 is H-level, and to the power supply VCC when the first control signal CONT1 is L-level.

Firstly, an operation is described of the data generation circuit 20 when the first control signal CONT1 is H-level. Since the NMOS transistor 30 and resistor 32 make up an inverter, a clock signal SCLK is output, which is a digital signal according to a level of the audio signal RIN input to a gate electrode of the NMOS transistor 30. More specifically, when the level of the audio signal RIN is higher than a threshold voltage of the inverter made up of the NMOS transistor 30 and resistor 32, the clock signal SCLK is L-level, and when the level of the audio signal RIN is lower than the above threshold voltage, the clock signal SCLK is H-level. Similarly, since the NMOS transistor 31 and resistor 33 also make up an inverter, the data SDA is output, which is a digital signal according to a level of the audio signal LIN, from the inverter made up of the NMOS transistor 31 and resistor 33.

Secondly, when the first control signal CONT1 is L-level, each of the source electrodes of the NMOS transistors 30 and 31 and each of the drain electrodes thereof are connected to the power supply VCC. Thus, the clock signal SCLK and data SDA are always H-level irrespective of the levels of the audio signals RIN and LIN to be input.

The enable signal CE input to the first setting circuit 40 of the FM transmission circuit 21 is changed to H-level or L-level by the external switch (not shown) being switched in state by the user, as described above. The enable signals CE are input to one input of the AND circuit 50 and one input of the AND circuit 51. Thus, when the enable signal CE is H-level, the clock signal SCLK is output as a clock signal CLK from the AND circuit 50, and the data SDA is output as data DA from the AND circuit 51. On the other hand, when the enable signal CE is L-level, each of the clock signal CLK output from the AND circuit 50 and the data DA output from the AND circuit 51 is L-level.

The shift register 52 is an n-bit register, and is a circuit for sequentially shifting and holding the data DA output from the AND circuit 51 in timing of a rising edge of the clock signal CLK output from the AND circuit 50. It is assumed that the shift register 52 outputs n1-bit data, which is input earlier in time in n-bit data held therein, as an address selection signal AO to the address decoder 53, and outputs n2-bit data, which is input later in time in the n-bit data, as set data DO to the latch circuit 54.

It is assumed that a predetermined n1-bit address is assigned to the address decoder 53, and when the address selection signal AO matches the predetermined address, the address decoder 53 outputs a decode signal DEC for updating the data held by the latch circuit 54 to the latch circuit 54.

It is assumed that the latch circuit 54 is a circuit which, when the decode signal DEC is output thereto, latches the n2-bit set data DO output from the shift register 52 to output the set data DO, as latch data LD, to the output circuit 41.

Firstly, an operation is described of the first setting circuit 40 when the enable signal CE is H-level. Since one input of the AND circuits 50 and one input of the AND circuit 51 are H-level, the clock signal SCLK is output as the clock signal CLK from the AND circuit 50, and the data SDA is output as the data DA from the AND circuit 51. In the shift register 52, the data DA, which is input in the timing of the rising edge of the clock signal CLK, is sequentially shifted and held. When the address selection signal AO output from the shift register 52 matches the predetermined address of the address decoder 53, the latch circuit 54 outputs, as the latch data LD, the n2-bit set data DO which is input later in time in the data DA input to the shift register 52. On the other hand, when the address selection signal AO output from the shift register 52 does not match the predetermined address of the address decoder 53, the decode signal DEC is not input to the latch circuit 54, and therefore, the latch data LD is not updated.

Secondly, when the enable signal CE is L-level, one input of the AND circuits 50 and one input of the AND circuit 51 are L-level. Accordingly, the clock signal CLK and the data DA output from the AND circuits 50 and 51 are L-level irrespective of a clock signal SCLK and data SDA to be input, and therefore, the data held in the shift register 52 are not updated. Consequently, since the decode signal is not output from the address decoder 53, the latch data LD are not updated.

The second setting circuit 60 in the output circuit 41 is a circuit which outputs predetermined n3-bit data as a first set signal SET1 to the stereo modulation circuit 61, predetermined n4-bit data as a second set signal SET2 to the frequency modulation circuit 62, and predetermined n5-bit data as a third set signal SET3 to the power amplifier 63, in the n2-bit latch data LD input from the latch circuit 54.

The stereo modulation circuit 61 is a circuit which sets the audio signals RIN and LIN input from the music reproduction device (not shown) to levels that are based on the first set signal SET1 of n3 bits, and then generates a stereo composite signal SO. The stereo modulation circuit 61 according to an embodiment of the present invention includes an attenuator (not shown) capable of attenuating the levels of the audio signals RIN and LIN based on the first set signal SET1 of n3 bits.

The frequency modulation circuit 62 is a circuit which generates a carrier wave of a frequency that is based on the second set signal SET2 of n4 bits to modulate the carrier wave with the stereo composite signal SO from the stereo modulation circuit 61. In an embodiment of the present invention, the carrier wave modulated with the stereo composite signal SO is denoted by a modulated signal MOD.

The power amplifier 63 is a circuit which amplifies power of the modulated signal MOD with an amplification factor which is based on the third set signal SET3 of n5 bits, to be output as an output signal OUT from an antenna (not shown) connected to the terminal 85.

According to an embodiment of the present invention, a configuration is made, as mentioned before, such that each of the stereo modulation circuit 61, the frequency modulation circuit 62, and the power amplifier 63 can be set as to a circuit state. However, it is not necessary that all of the circuits are changed in state every time the latch data LD is updated. That is, it is possible that one or two circuits among the stereo modulation circuit 61, the frequency modulation circuit 62, and the power amplifier 63 are changed in state. Specifically, for example, when changing only the amplification factor in the power amplifier 63, in the latch data which has already been held, such data may be updated that only the n5-bit data for the third set signal SET3 is changed while the n3-bit data for the first set signal SET1 and the n4-bit data for the second set signal SET2 are not changed, as a new latch data LD in the latch circuit 54.

Here, an operation is described of the transmission device 10 according to an embodiment of the present invention.

Hereinafter, in an embodiment of the present invention, a description is made assuming that the shift register 52 is a 10-bit register and that, in data input to the shift register 52, 4-bit datft input earlier in time is used as the address selection signal AO, and the 6-bit data input later in time is used as the set data DO. It is also assumed that, in the 6-bit set data DO, 2-bit dat which is input to the shift register 52 just after the address selection signal AO is data for setting an attenuation amount of the attenuator (not shown), and the following 2-bit data is data for setting a frequency of the carrier wave, and the last 2-bit one is data for setting an amplification factor of the power amplifier 63.

Furthermore, an address assigned to the address decoder 53 is represented by, for example, (1, 0, 1, 0), which is hereinafter denoted as first address data AD1, in an embodiment of the present invention. In addition, data for a desirable attenuation amount of the attenuator (not shown) is represented by, for example, (1, 1), data for a desirable frequency of the carrier wave is represented by, for example, (0, 1), and data for desirable amplification factor of the power amplifier 63 is represented by, for example, (1, 0). Accordingly, in an embodiment of the present invention, in order to set the above desirable data respectively for the stereo modulation circuit 61, the frequency modulation circuit 62, and the power amplifier 63, the data (1, 0, 1, 0) and the data (1, 1), (0, 1), and (1, 0) need to be input sequentially as the serial data SDA to the shift register 52 on the rising edge of the clock signal SCLK, in the first setting circuit 40. In an embodiment of the present invention, the data (1, 1), (0, 1), and (1, 0), which are sequentially input so as to desirably set each of the stereo modulation circuit 61, the frequency modulation circuit 62, and the power amplifier 63, are put together to be represented as a first data Dl (1, 1, 0, 1, 1, 0).

As described before, the data generation circuit 20 inverts the levels of the input signals RIN and LIN by the inverters to be rendered the clock signal SCLK and data SDA, respectively. Accordingly, in order to output the first address data AD1 and first data Dl as the data SDA from the data generation circuit 20 on the rising edge of the clock signal SCLK, the data obtained by inverting each bit of the first address data AD1 and first data Dl needs to be input as the audio signal LIN to the data generation circuit 20 on the falling edge of the inverted clock signal SCLK. In an embodiment according to the present invention, data (0, 1, 0, 1) obtained by inverting each bit of the first address data AD1 is denoted by second address data AD2, and data (0, 0, 1, 0, 0, 1) obtained by inverting each bit of the first data D1 is denoted by second data D2. In an embodiment of the present invention, it is assumed that in the music reproduction device (not shown) a setting music file is saved in advance so that the second address data AD2 and second data D2 are output as the audio signal LIN, in synchronization with the falling edge of a predetermined clock signal output as the audio signal RIN.

Figure 2:
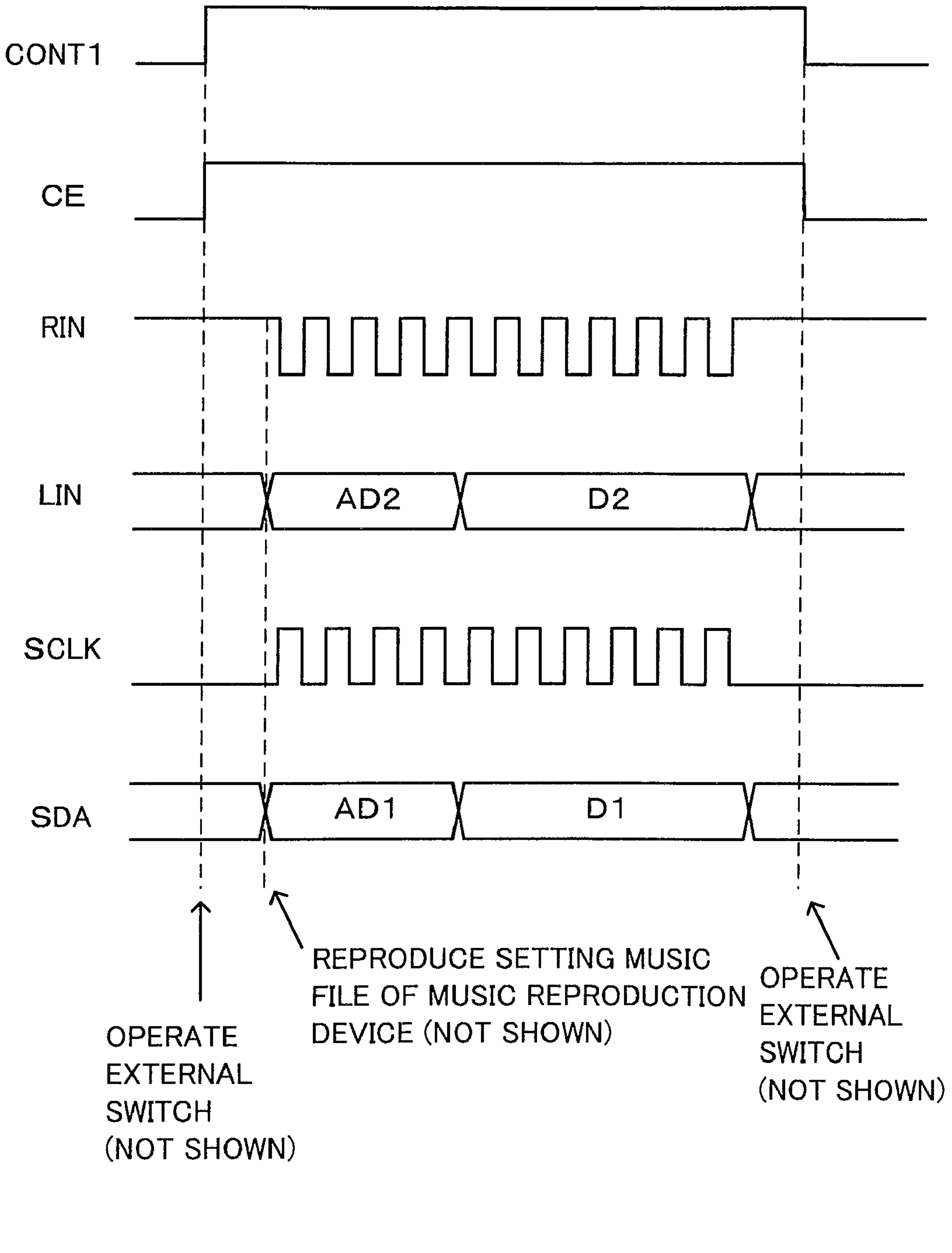
FIG. 2 is a timing chart for explaining an operation of a transmission device 10.

Firstly, the user operates the external switch (not shown) so that both of the first control signal CONT1 and enable signal CE are H-level, as shown in a timing chart of major signals in the transmission device 10 shown in FIG. 2. Then, the above setting music file saved in the music reproduction device (not shown) is read and the setting music file is reproduced. As a result, the predetermined clock signal is input as the audio signal RIN, and the second address data AD2 and second data D2 are input as an audio signal LIN, to the data generation circuit 20, respectively. As described before, the data generation circuit 20 inverts a level of the audio signal RIN and a level of the audio signal LIN respectively by inverters. Accordingly, the first address data AD1 and first data Dl are output as the data SDA from the data generation circuit 20 in synchronization with the rising edge of the clock signal SCLK. Since the enable signal CE is H-level, the first address data AD1 and then the first data Dl are sequentially input to the shift register 52 in the first setting circuit 40. Since the first address data AD1 is so set as to match the address assigned to the address decoder 53, when the first address data AD1 and first data Dl are all held by the shift register 52, the address decoder 53 outputs the decode signal DEC. The shift register 52 outputs the first data Dl as the set data DO to the latch circuit 54. When the decode signal DEC is input to the latch circuit 54, the latch circuit 54 outputs the first data Dl as the latch data LD to the second setting circuit 60 in the output circuit 41. Thus, the second setting circuit 60, based on the first data Dl, outputs the first set signal SET1, second set signal SET2, and third set signal SET3 to the stereo modulation circuit 61, frequency modulation circuit 62, and power amplifier 63, respectively, and therefore, the above circuits are set in desirable states.

Secondly, the user operates the external switch (not shown) so that the first control signal CONT1 and the enable signal CE are L-level. In an embodiment according to the present invention, since the numbers of bits of the first address data AD1 and first data Dl and a period of the clock signal SCLK are determined in advance, the user can operate the external switch (not shown) so that the first control signal CONT1 and enable signal CE become L-levels after the latch data LD is updated. Then, the user operates the music reproduction device (not shown) so that a desirable music file saved in the music reproduction device (not shown) is selected and the audio signals RIN and LIN are output based on the desirable music file from the music reproduction device (not shown.) At this time, the first control signal CONT1 is L-level, and therefore, outputs of the data generation circuit 20 are H-level irrespective of the levels of audio signals RIN and LIN. Furthermore, since the enable signal CE is L-level, data held in the shift register 52 is not updated, and therefore, the output circuit 41 is not changed in state. As a result, the output circuit 41 modulates the carrier wave of the desirable frequency with the stereo composite signal SO according to the audio signals RIN and LIN, to output the output signal OUT of a desirable level to the antenna (not shown.)

The transmission device 10 according to an embodiment of the present invention having a configuration described above can set the attenuation amount of the audio signals RIN and LIN input to the FM transmission circuit 21, the frequency of the carrier wave, and the amplification factor of the modulated signal MOD, by inputting the predetermined clock signal as the audio signal RIN and the second address data AD2 and second data D2 as the audio signal LIN from a music reproduction device (not shown.) Generally speaking, in order to set the frequency, etc., as described above, for an FM transmission circuit, a microcomputer is needed. In order to set a frequency of a carrier wave, it is required to provide a setting device for setting the frequency of the carrier wave, a display screen (not shown) for displaying the frequency of the carrier wave, a driving circuit for driving the display screen, etc., as described in Japanese Patent Laid-Open publication No. 2007-88657, for example. In the transmission device 10 according to an embodiment of the present invention, a mounting area can be made smaller, as compared with the above common transmission device. In addition, the above display screen, etc., for displaying the frequency of the carrier wave are not required, and therefore, costs can be reduced. In an embodiment of the present invention, the switches SW1 and SW2 are provided. However, a configuration may be made such that the terminal 82 is connected with the power supply VCC, and the source electrodes of the NMOS transistors 30 and 31 are connected with the ground GND, respectively, without using the switches SW1 and SW2, for example. In a case where a common music file is reproduced, digital signals having waveforms illustrated in FIG. 2 are not likely to be output as the audio signals RIN and LIN. Accordingly, even in a case of a configuration where the above switches SW1 and SW2 are not used, data held in the latch circuit 54 is not likely to be updated by the audio signals RIN and LIN, and thus, there is a low probability that data are erroneously set for the second setting circuit 60 in the output circuit 41.

In the transmission device 10 according to an embodiment of the present invention, after the frequency being set of the carrier wave of the FM transmission circuit 21, the external switch (not shown) is so operated that the first control signal CONT1 becomes L-level. Therefore, while a music file being reproduced, the clock signal SCLK and data SDA of H-level are always output from the generation circuit 20, thereby extremely decreasing a probability that the data held in the latch circuit 54 are erroneously updated. Furthermore, when the first control signal CONT1 is L-level, even during the reproduction of a music file, a current is not passed through the inverter made up of the NMOS transistor 30 and resistor 32, nor in the inverter made up of the NMOS transistor 30 and resistor 32, and therefore, power consumption can be reduced.

In the FM transmission circuit 21 according to an embodiment of the present invention, the latch data LD of the output circuit 41 is updated only when the address decoder 53 outputs the decode signal DEC. Therefore, for example, in the case of a configuration where the switches SW1 and SW2 are not provided, and the terminal 82 is connected with the power supply VCC and each of the source electrodes of the NMOS transistors 30 and 31 is connected with the ground GND, and even in a case of erroneously operating the switches SW1 and SW2 in an embodiment of the present invention, data of the second setting circuit in the output circuit 41 is not likely to be set erroneously.

The transmission device 10 according to an embodiment of the present invention is provided with the switch SW1 capable of changing the level of the enable signal CE by operating the external switch (not shown.) Therefore, for example, in a case where the frequency of the carrier wave of the FM transmission circuit 21 is set with the clock signal SCLK, data SDA, and enable signal CE, that is, in a case where the frequency is set by means of common three-wire system data transmission, the user can implement the setting by operating the external switch (not shown) in accordance with inputs of the clock signal SCLK and data SDA.

The above embodiments of the present invention are simply for facilitating the understanding of the present invention and are not in any way to be construed as limiting the present invention. The present invention may variously be changed or altered without departing from its spirit and encompass equivalents thereof.

For example, in the FM transmission circuit 21 according to an embodiment of the present invention, the user operates the external switch (not shown) in accordance with inputs of the clock signal SCLK and data SDA to change the enable signal CE. However, in a case of common two-wire system data transmission, only the clock signal SCLK and data SDA are input to the FM transmission circuit 21. Accordingly, in a case where the FM transmission circuit 21 is only used for the two-wire system data transmission, a configuration may be made such that the clock signal SCLK and data SDA are directly input to the shift register 52. Consequently, in the transmission device 10, the switch SW1 and the external switch (not shown) for controlling the switch SW1, the AND circuits 50 and 51 in the FM transmission circuit 21, and the terminal 82 can be eliminated. Even in the above case where the switch SW1, etc., are eliminated, if the first control signal CONT1 is rendered L-level after the clock signal SCLK and data SDA are directly input to the shift register 52, both the clock signal SCLK and data SDA become H-level, thereby decreasing a probability that erroneous data is input to the shift register 52.

In the transmission device 10 according to an embodiment of the present invention, only the FM transmission circuit 21 is an integrated circuit, however, the data generation circuit 20 and switch SW1 can also be integrated. In a case where the data generation circuit 20 and switch SW1 are integrated, the terminals 80 and 81 can be eliminated.

The output circuit 41 according to an embodiment of the present invention includes a configuration that the attenuation amount of the attenuator (not shown) in the stereo modulation circuit 61, the frequency of the carrier wave in the frequency modulation circuit 62, and the amplification factor of the power amplifier 63 are set based on the latch data LD, however, this is not limitative. For example, a configuration may be made such that the output circuit 41 includes a bias current circuit (not shown) for supplying a bias current according to a reference current to each of circuits included in the output circuit 41 and a reference current value of the bias current circuit (not shown) is set based on the latch data LD. In this case, for example, if the reference current value of the second setting circuit 60 is set at O (zero) based on the latch data LD, a consumption current of the output circuit 41 is suppressed. Furthermore, a configuration may be made such that, the second setting circuit 60 can change the stereo composite signal SO output from the stereo modulation circuit 61 from a stereo signal to a monaural signal based on latch data LD.

The attenuator (not shown) of the stereo modulation circuit 61 according to an embodiment of the present invention attenuates both the levels of the input audio signals RIN and LIN based on the latch data LD. However, a configuration may be made, for example, such that a first attenuator (not shown) and a second attenuator (not shown) are provided as the attenuator (not shown) so that each of the levels can be attenuated of the audio signals RIN and LIN, thereby changing the attenuation amount of one of the above two attenuators based on the latch data LD.

As mentioned before, the music reproduction device (not shown) according to an embodiment of the present invention outputs the second address data AD2 and second data D2 as the audio signal LIN in synchronization with the falling edge of the predetermined clock signal output as the audio signal RIN by reproducing the stored setting music file. However, some music reproduction devices output first address data AD1 and first data D1, which are inverted, and an inverted audio signal RIN, instead of the second address data AD2 and second data D2, which are desirable, even when reproducing the above setting music file. In the other words, when reproducing a setting music file, some music reproduction devices output desirable logical data, etc., while some music reproduction devices output logical data obtained by inverting the desirable logic, etc. Here, the music reproduction device which outputs the desirable logical data in reproducing the setting music file is referred to as a positive-logic output music reproduction device, and the music reproduction device which outputs the logical data obtained by inverting the desirable logic is referred to as a negative-logic output music reproduction device. Accordingly, in a case where the music reproduction device used by the user is the negative-logic output music reproduction device, data obtained by inverting the audio signal LIN is input to the shift register 52 in synchronization with the rising edge of the predetermined clock signal output as the audio signal RIN. For this reason, even in a case of reproducing the setting music file so as to update the latch data LD, the first address data AD1 assigned to the address decoder 53 is not input, and accordingly, the latch data LD is not updated. Therefore, instead of the above setting music file, a setting music file may be used, which is capable of outputting data compatible with each of the positive-logic output and negative-logic output music reproduction devices. Hereinafter, an operation is described of the transmission device 10 when using such a setting music file referring to FIG. 3 and FIG. 4.

Figure 3:
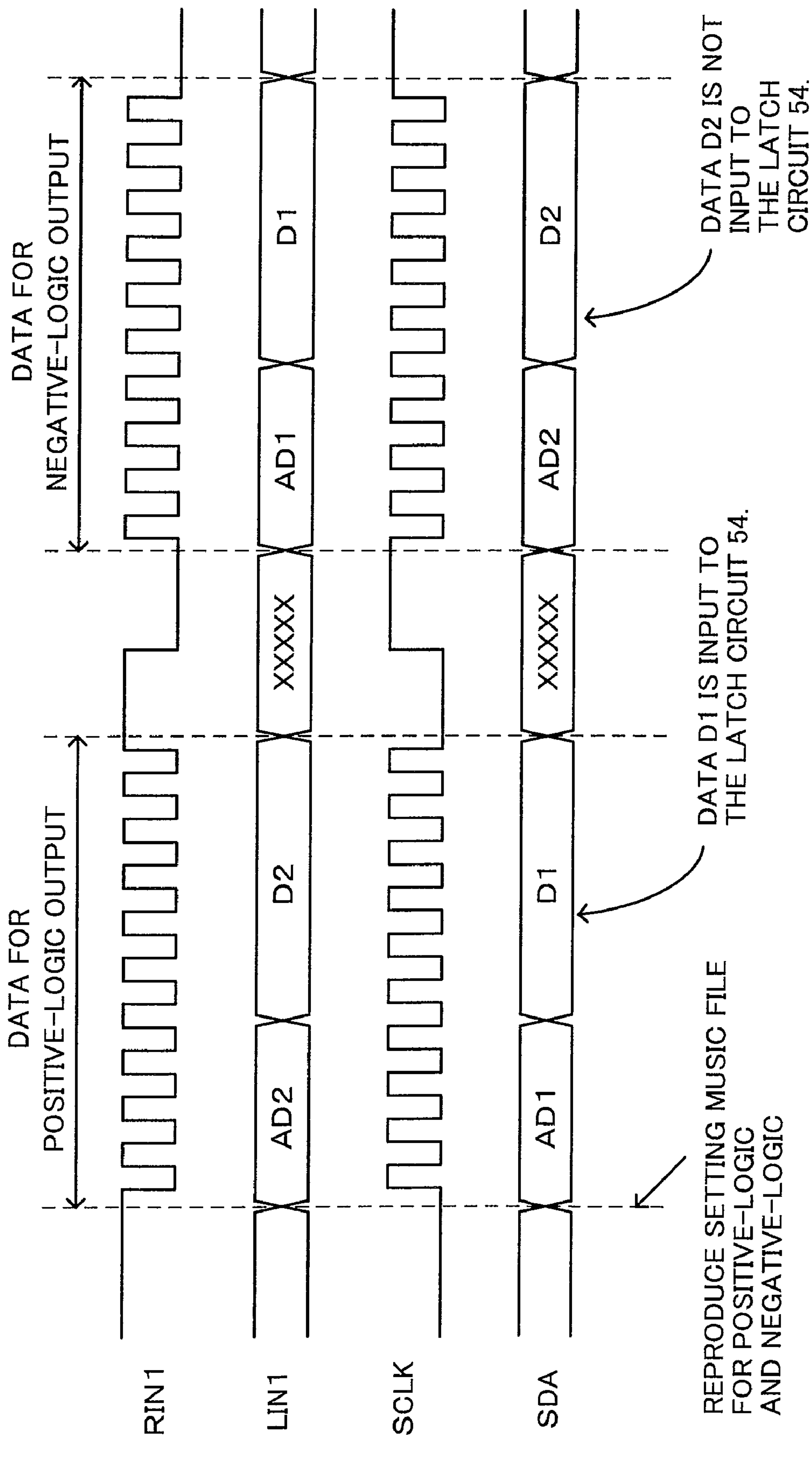
FIG. 3 is a timing chart showing an example of an address and data output from a music reproduction device having a positive logic output.

FIG. 3 shows an example of waveforms when the positive-logic output music reproduction device reproduces the above setting music file. Here, the right side audio signal output from the positive-logic output music reproduction device corresponds to an audio signal RIN1 and the left side audio signal output therefrom corresponds to an audio signal LIN1, respectively. In addition, it is assumed herein that when the setting music file is reproduced, data for a positive-logic output and data for a negative-logic output are output in turn. The positive-logic output music reproduction device firstly outputs the second address data AD2 and second data D2, which are data for the positive-logic output, in synchronization with the falling edge of the predetermined clock signal output as the audio signal RIN1. Then, the positive-logic output music reproduction device outputs the first address data AD1 and first data D1, which are data for the negative-logic output, in synchronization with the rising edge of the predetermined clock signal output the audio signal RIN1. The audio signals RIN1 and LIN1 are inverted in the data generation circuit 20 into the clock signal SCLK and data SDA. Accordingly, the first address data AD1 and first data D1 are input to the shift register 52 in synchronization with the rising edge of the clock signal SCLK, and the data obtained by inverting the audio signal LIN1 is input in synchronization with the rising edge of the clock signal SCLK. However, as described before, the address assigned to the address decoder 53 is the first address data AD1, and therefore, only the first data D1 is stored in the latch circuit 54 based on the data for the positive-logic output, as a result. That is, the data obtained by inverting the audio signal LIN1 based on the data for the negative-logic output is not input to the latch circuit 54.

Figure 4:
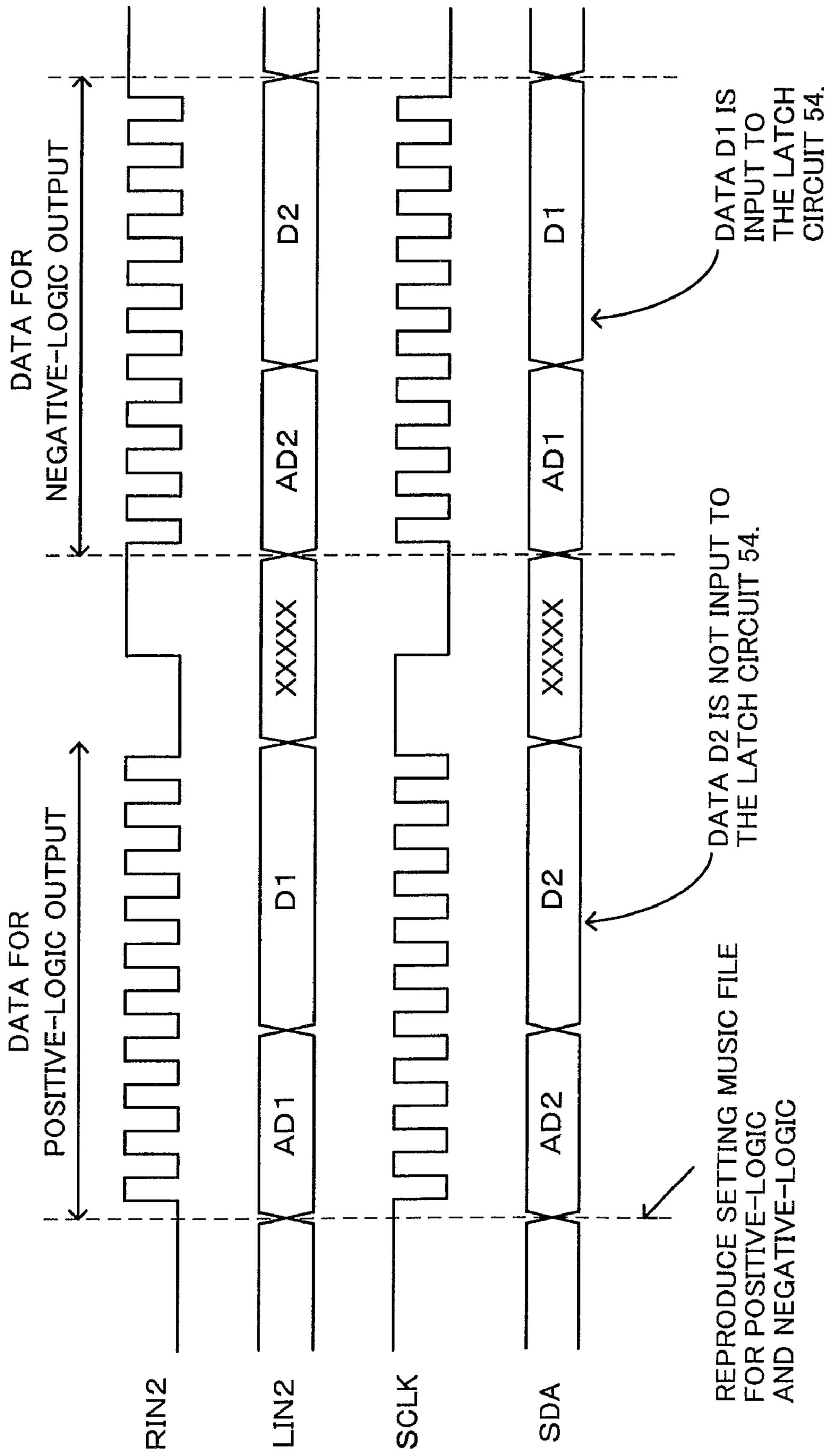
FIG. 4 is a timing chart showing an example of an address and data output from a music reproduction device having a negative logic output.
Figure 5:
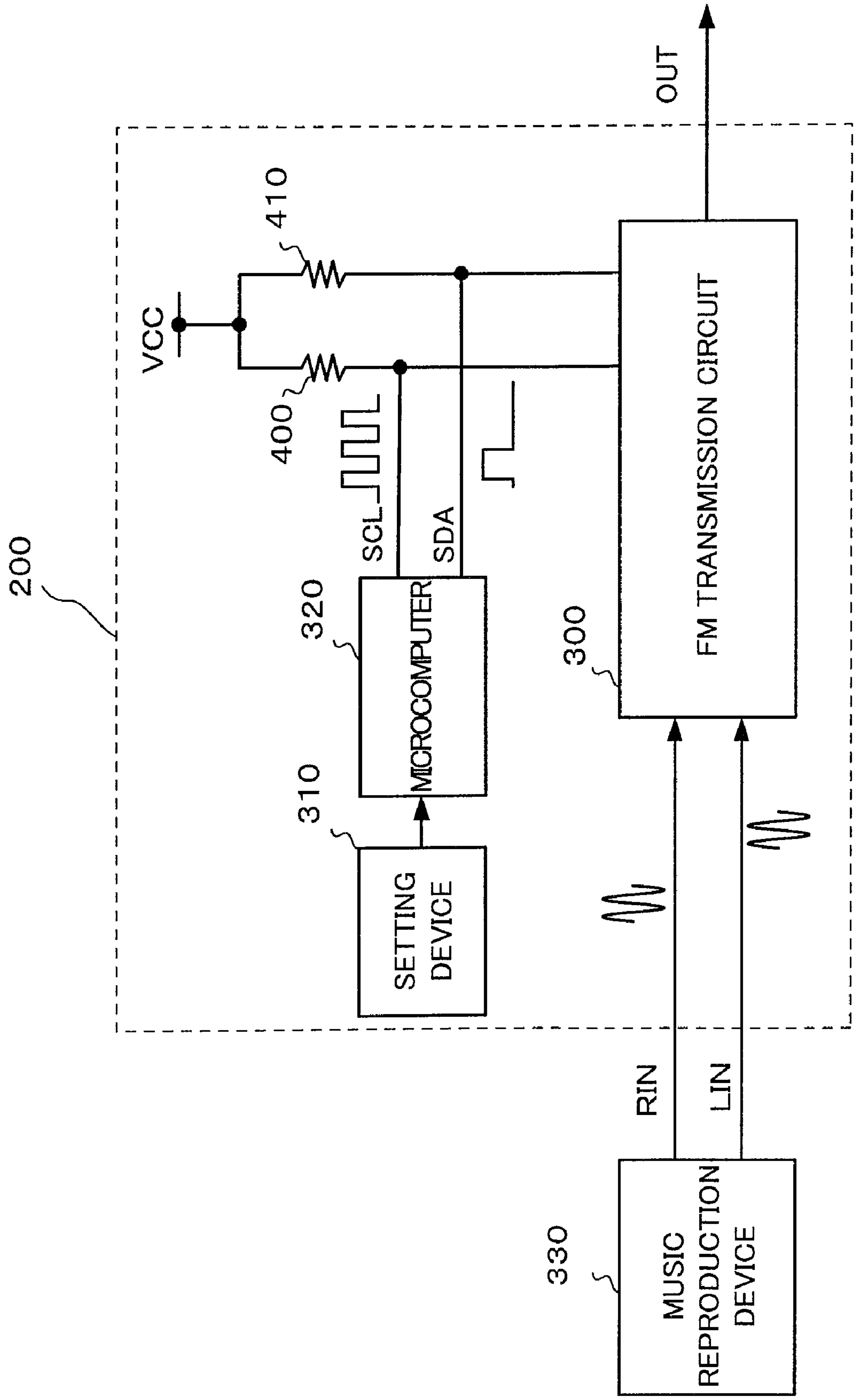
FIG. 5 shows an example of a transmission device.

FIG. 4 shows an example of waveforms when the negative-logic output music reproduction device reproduces the setting music file capable of outputting data compatible with each of the positive-logic output and negative-logic output music reproduction devices. Here, the right side audio signal output from the negative-logic output music reproduction device corresponds to an audio signal RIN1 and the left side audio signal output therefrom corresponds to an audio signal LIN2. When the above setting music file is reproduced, the negative-logic output music reproduction device outputs the audio signals RIN2 and LIN2 obtained by inverting logics of the audio signals RIN1 and LIN1. That is, firstly, the first address data AD1 and first data Dl are output as data for the positive-logic output from the music reproduction device in synchronization with the rising edge of the predetermined clock signal. Then, the second address data AD2 and second data D2 are output as data for a negative-logic output from the music reproduction device in synchronization with the falling edge of the predetermined clock signal. Thus, firstly, data obtained by inverting the audio signal LIN2 is input to the shift register 52 in synchronization with the rising edge of the clock signal SCLK. Then, the first address data AD1 and first data Dl are input to the shift register 52 in synchronization with the rising edge of the clock signal SCLK. As a result, only the first data Dl which is based on the data for the negative-logic output is stored in the latch circuit 54. On the other hand, the data obtained by inverting the audio signal LIN2 which is based on the data for the positive-logic output is not input to the latch circuit 54. Thus, the latch data LD can be updated with reliability, by using the setting music file compatible with each of the positive-logic output and negative-logic output music reproduction devices, in either of the cases where the positive-logic output music reproduction device is used or the negative-logic output music reproduction device is used.

What is claimed is:

1. An audio signal processing circuit comprising:

a set data output circuit configured to receive a first audio signal and a second audio signal and to generate a clock signal based on the first audio signal and set data based on the second audio signal;

a holding circuit configured to receive the set data in accordance with the clock signal and to hold the set data; and a processing circuit configured to receive the first audio signal and the second audio signal in parallel and to process at least one of the first audio signal and the second audio signal based on the set data held by the holding circuit.

2. The audio signal processing circuit according to claim 1, wherein the processing circuit includes:

a signal processing circuit configured to process at least one of the first audio signal and the second audio signal; and a setting circuit configured to control an operation of the signal processing circuit based on the set data held by the holding circuit.

3. The audio signal processing circuit according to claim 2, wherein the set data output circuit includes:

an output circuit configured to be able to generate the clock signal corresponding to a level of the first audio signal and the set data corresponding to a level of the second audio signal; and a control circuit configured to control the output circuit so as to output the clock signal and the set data to the holding circuit when a selection signal is at one logic level, and so as not to output the clock signal and the set data to the holding circuit when the selection signal is at the other logic level, the selection signal being a signal that is at the one logic level when the first audio signal corresponds to the clock signal and the second audio signal corresponds to the set data.

4. The audio signal processing circuit according to claim 3, wherein the holding circuit is configured to be able to update the set data when an instruction signal to be input is at one logic level, and wherein the audio signal processing circuit further comprises an update control circuit configured to output the instruction signal of the one logic level when an update control signal is at one logic level, and output the instruction signal of the other logic level when the update control signal is at the other logic level, the update control signal being a signal that is at the one logic level when the first audio signal corresponding to the clock signal is input to the set data output circuit.

5. The audio signal processing circuit according to claim 2, wherein the holding circuit holds the set data when address data to be input according to the clock signal matches predetermined address data, and wherein the set data output circuit outputs the clock signal to the holding circuit based on the first audio signal corresponding to the clock signal, and outputs the address data to the holding circuit based on the second audio signal corresponding to the address data, and thereafter, further outputs the clock signal to the holding circuit based on the first audio signal corresponding to the clock signal, and outputs the set data to the holding circuit based on the second audio signal corresponding to the set data.

6. The audio signal processing circuit according to claim 2, wherein the holding circuit is configured to be able to update the set data when an instruction signal to be input is at one logic level, and wherein the audio signal processing circuit further comprises an update control circuit configured to output the instruction signal of the one logic level when an update control signal is at one logic level, and output the instruction signal of the other logic level when the update control signal is at the other logic level, the update control signal being a signal that is at the one logic level when the first audio signal corresponding to the clock signal is input to the set data output circuit.

7. The audio signal processing circuit according to claim 1, wherein the set data output circuit includes:

an output circuit configured to be able to generate the clock signal corresponding to a level of the first audio signal and the set data corresponding to a level of the second audio signal; and a control circuit configured to control the output circuit so as to output the clock signal and the set data to the holding circuit when a selection signal is at one logic level, and so as not to output the clock signal and the set data to the holding circuit when the selection signal is at the other logic level, the selection signal being a signal that is at the one logic level when the first audio signal corresponds to the clock signal and the second audio signal corresponds to the set data.

8. The audio signal processing circuit according to claim 7, wherein the holding circuit holds the set data when address data to be input according to the clock signal matches predetermined address data, and wherein the set data output circuit outputs the clock signal to the holding circuit based on the first audio signal corresponding to the clock signal, and outputs the address data to the holding circuit based on the second audio signal corresponding to the address data, and thereafter, further outputs the clock signal to the holding circuit based on the first audio signal corresponding to the clock signal, and outputs the set data to the holding circuit based on the second audio signal corresponding to the set data.

9. The audio signal processing circuit according to claim 7, wherein the holding circuit is configured to be able to update the set data when an instruction signal to be input is at one logic level, and wherein the audio signal processing circuit further comprises an update control circuit configured to output the instruction signal of the one logic level when an update control signal is at one logic level, and output the instruction signal of the other logic level when the update control signal is at the other logic level, the update control signal being a signal that is at the one logic level when the first audio signal corresponding to the clock signal is input to the set data output circuit.

10. The audio signal processing circuit according to claim 1, wherein the holding circuit holds the set data when address data to be input according to the clock signal matches predetermined address data, and wherein the set data output circuit outputs the clock signal to the holding circuit based on the first audio signal corresponding to the clock signal, and outputs the address data to the holding circuit based on the second audio signal corresponding to the address data, and thereafter, further outputs the clock signal to the holding circuit based on the first audio signal corresponding to the clock signal, and outputs the set data to the holding circuit based on the second audio signal corresponding to the set data.

11. The audio signal processing circuit according to claim 1, wherein the holding circuit is configured to be able to update the set data when an instruction signal to be input is at one logic level, and wherein the audio signal processing circuit further comprises an update control circuit configured to output the instruction signal of the one logic level when an update control signal is at one logic level, and output the instruction signal of the other logic level when the update control signal is at the other logic level, the update control signal being a signal that is at the one logic level when the first audio signal corresponding to the clock signal is input to the set data output circuit.

* * * * *

UNITED STATES PATENT AND TRADEMARK OFFICE

CERTIFICATE OF CORRECTION

PATENT NO. : 8,126,151 B2
APPLICATION NO. : 12/265378
DATED : February 28, 2012
INVENTOR(S) : Obuchi et al.

It is certified that error appears in the above-identified patent and that said Letters Patent is hereby corrected as shown below:

Column 5, line 40: replace --datft-- with "data"

Column 5, line 42: replace --dat-- with "data"

Signed and Sealed this
First Day of May, 2012

David J. Kappos
*Director of the United States Patent and Trademark Office*